(12) United States Patent
Ma

(10) Patent No.: US 9,791,735 B2
(45) Date of Patent: Oct. 17, 2017

(54) ARRAY SUBSTRATE, LIQUID CRYSTAL DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lei Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 297 days.

(21) Appl. No.: 14/387,972

(22) PCT Filed: Nov. 29, 2013

(86) PCT No.: PCT/CN2013/088106
§ 371 (c)(1),
(2) Date: Sep. 25, 2014

(87) PCT Pub. No.: WO2014/194613
PCT Pub. Date: Dec. 11, 2014

(65) Prior Publication Data
US 2016/0187725 A1 Jun. 30, 2016

(30) Foreign Application Priority Data
Jun. 8, 2013 (CN) .......................... 2013 1 0228782

(51) Int. Cl.
G02F 1/1343 (2006.01)
G02F 1/1335 (2006.01)
(Continued)

(52) U.S. Cl.
CPC ...... *G02F 1/133603* (2013.01); *G02F 1/1368* (2013.01); *G02F 1/133512* (2013.01);
(Continued)

(58) Field of Classification Search
CPC .......................................... G02F 2001/134372
See application file for complete search history.

(56) References Cited

U.S. PATENT DOCUMENTS

2009/0128753 A1   5/2009   Shi
2011/0299001 A1   12/2011  Banin et al.
(Continued)

FOREIGN PATENT DOCUMENTS

CN   101110448 A   1/2008
CN   101435961 A   5/2009
(Continued)

OTHER PUBLICATIONS

International Search Report Appln. No. PCT/CN2013/088106 ; Dated Jan. 19, 2014.
(Continued)

*Primary Examiner* — Phu Vu
(74) *Attorney, Agent, or Firm* — Ladas & Parry LLP; Loren K. Thompson

(57) ABSTRACT

An array substrate, a liquid crystal display panel and a display device with a simple structure are provided. The array substrate includes: a substrate; a plurality of sub-pixel units, located on the substrate and arranged in a matrix form; and a plurality of photoluminescent devices, located in the plurality of sub-pixel units, and emitting light with a corresponding color in correspondence with a color of the sub-pixel unit where it is located.

20 Claims, 5 Drawing Sheets

(51) Int. Cl.

| | |
|---|---|
| *G02F 1/1368* | (2006.01) |
| *H01L 27/12* | (2006.01) |
| *H01L 27/15* | (2006.01) |
| *H01L 33/00* | (2010.01) |
| *H01L 33/06* | (2010.01) |
| *H01L 33/28* | (2010.01) |
| *H01L 33/30* | (2010.01) |
| *G02F 1/1333* | (2006.01) |
| *G02F 1/1362* | (2006.01) |

(52) U.S. Cl.
CPC .. *G02F 1/133528* (2013.01); *G02F 1/134309* (2013.01); *H01L 27/1248* (2013.01); *H01L 27/156* (2013.01); *H01L 33/0025* (2013.01); *H01L 33/0029* (2013.01); *H01L 33/06* (2013.01); *H01L 33/28* (2013.01); *H01L 33/30* (2013.01); *G02F 1/136209* (2013.01); *G02F 2001/133357* (2013.01); *G02F 2001/133614* (2013.01); *G02F 2001/134345* (2013.01); *G02F 2001/134372* (2013.01)

(56) References Cited

U.S. PATENT DOCUMENTS

| | | | |
|---|---|---|---|
| 2012/0287381 A1* | 11/2012 | Li | G02F 1/133617 349/106 |
| 2013/0038818 A1 | 2/2013 | Toda et al. | |
| 2014/0092353 A1* | 4/2014 | Matsushima | G02F 1/133512 349/110 |
| 2014/0132890 A1 | 5/2014 | Zhang | |
| 2014/0204319 A1 | 7/2014 | Cai et al. | |
| 2015/0002788 A1 | 1/2015 | Guo et al. | |

FOREIGN PATENT DOCUMENTS

| | | |
|---|---|---|
| CN | 102751275 A | 10/2012 |
| CN | 102929037 A | 2/2013 |
| CN | 102944943 A | 2/2013 |
| CN | 103091895 A | 5/2013 |
| CN | 103293745 A | 9/2013 |
| CN | 103309087 A | 9/2013 |
| TW | 201037390 A | 10/2010 |

OTHER PUBLICATIONS

Fourth Chinese Office Action dated May 20, 2016: Appln. No. 201310228782.X.
First Chinese Office Action Appln. No. 201310225782.X; Dated Mar. 30, 2015.
International Search Report mailed Mar. 20, 2014; PCT/CN2013/088106.
Written Opinion of the International Searching Authority mailed Mar. 20, 2014; PCT/CN2013/088106.
Second Chinese Office Action dated Aug. 10, 2015; Appln. No. 201310228782.X.
International Preliminary Report on Patentability issued Dec. 8, 2015; PCT/CN2013/088106.
Third Chinese Office Action dated Jan. 4, 2016; Appln. No. 201310228782.X.

* cited by examiner

ARRAY SUBSTRATE, LIQUID CRYSTAL DISPLAY PANEL AND DISPLAY DEVICE

TECHNICAL FIELD

Embodiments of the present invention relate to an array substrate, a liquid crystal display panel and a display device.

BACKGROUND

Such a display device that has the advantages of high brightness, high aperture ratio, wide color gamut, pure chromaticity, low power consumption and so on is a goal pursued in the field of liquid crystal display.

A structure and display principle of an existing liquid crystal display device will be described in detail below.

The existing liquid crystal display device mainly comprises a liquid crystal display panel and a backlight module. The liquid crystal display panel mainly comprises a color filter substrate, an array substrate and a liquid crystal layer located between the color filter substrate and the array substrate. The backlight module provides the liquid crystal display panel with backlight, and when light passes through the liquid crystal layer of the liquid crystal display panel, liquid crystal molecules are deflected under the control of the array substrate so as to control grayscale of the light. After the light passes through color filters of the color filter substrate, red, green, blue and other lights are formed, and thus a color image is achieved.

The existing liquid crystal display panel has a relatively complex structure, and does not emit light itself, and light is provided by the backlight module entirely. Thus, the power consumption is larger, and this counts against realization of a liquid crystal display device with a low power consumption. Furthermore, when the color filter substrate and the array substrate available now are cell-assembled, an alignment error exists inevitably, resulting in a fact that the aperture ratio of the liquid crystal display device is restricted to a certain degree.

SUMMARY

According to embodiments of the invention, there are provided an array substrate, a liquid crystal display panel and a display device with a simple structure and lower power consumption.

In an aspect, there is provided an array substrate according to an embodiment of the invention, comprising: a substrate; a thin film transistor, formed on the substrate and comprising a source electrode, a drain electrode, a gate electrode and an active layer, a pixel electrode, formed on the substrate; a plurality of sub-pixel units, located on the substrate and arranged in a matrix form; and a plurality of photoluminescent devices, each of which is located in each of the plurality of sub-pixel units, and each of which emits light with a corresponding color in correspondence with a color of the sub-pixel unit where it is located.

In another aspect, there is provided a liquid crystal display panel according to an embodiment of the invention, comprising: a first substrate, being the array substrate as mentioned above; a second substrate, cell-assembled with the first substrate; a liquid crystal layer, interposed between the first substrate and the second substrate; and a common electrode, located at a side of the first substrate or the second substrate facing the liquid crystal layer.

In still another aspect, there is further provided a display device according to an embodiment of the invention, comprising: a liquid crystal display panel, as mentioned above; and a backlight source, disposed at a light entering side of the liquid crystal display panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to embodiments of the invention, there are provided an array substrate, a liquid crystal display panel and a display device with a simple structure and a lower power consumption.

By means of providing a plurality of photoluminescent devices for emitting lights with corresponding colors in correspondence with sub-pixel units where they are located in the array substrate of the liquid crystal display panel according to embodiments of the invention, each of the photoluminescent devices emits light in correspondence with color of the sub-pixel unit where it is located under the irradiation of light from a backlight source in a backlight module. A grayscale of lights emitted by the photoluminescent devices in the array substrate is determined by liquid crystal molecules under the action of an electric field. Displaying of a color image can be achieved by the liquid crystal panel that comprises the array substrate provided by embodiments of the invention. The liquid crystal panel provided by embodiments of the invention does not require provision of color filters, and has a simple structure. And, lights are provided by the photoluminescent devices, and a power of the backlight source in the backlight module is reduced. Accordingly, the power consumption of the whole display device is reduced.

In general, a plurality of sub-pixel units disposed in a matrix form are comprised in an array substrate of a liquid crystal panel, and each of the sub-pixel units may be a red, green or blue sub-pixel unit. Namely, the red, green and blue sub-pixel units correspond to red, green and blue color filters on a color filter substrate, respectively, and light that exits after passing through the array substrate and the color filter substrate has a color in correspondence with a sub-pixel unit. Exemplarily, the array substrate is not limited to only contain the sub-pixel units with the red, green and blue three colors, and may also contain a sub-pixel unit with any other color. No specific limit will be set here.

Hereinafter, the array substrate, the liquid crystal display panel and the display device provided by embodiments of the invention will be described one by one with reference to an example in which an array substrate comprises red, green and blue sub-pixel units in connection with the drawings.

Figure 1:
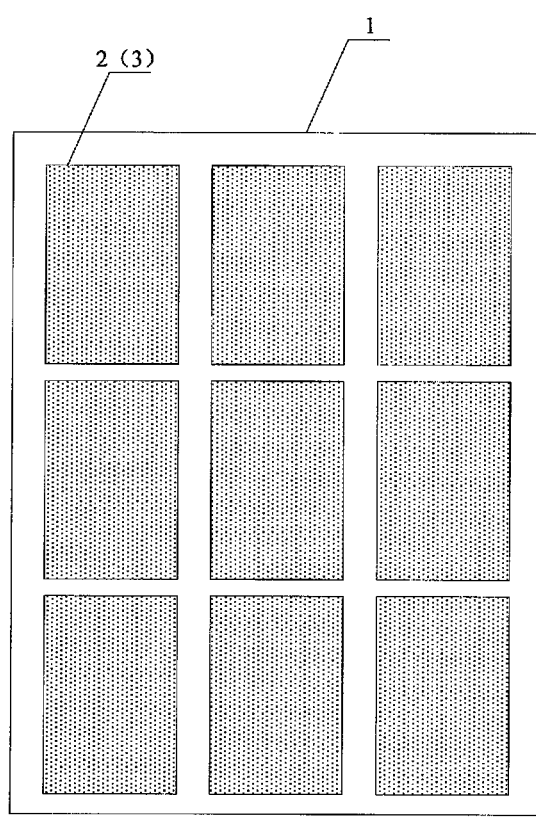
FIG. 1 is a first schematically top view illustrating an array substrate provided by an embodiment of the invention.

FIG. 1 is a schematically top view illustrating an array substrate provided by an embodiment of the invention. As shown in FIG. 1, the array substrate comprises: a substrate 1; a plurality of red, green and blue sub-pixel units 2 that are located on the substrate 1 and arranged in a matrix form; and a plurality of photoluminescent devices 3 that are respectively located in the red, green and blue sub-pixel units 2 and emit red light, green light and blue light corresponding to the red, green and blue sub-pixel units 2 in a one-to-one correspondence relationship.

A plurality of photoluminescent devices that emit the red light, the green light and the blue light corresponding to the red, green and blue sub-pixel units in a one-to-one correspondence relationship are provided in the array substrate according to embodiments of the invention. Exemplarily, each photoluminescent device emits light with a corresponding color with a higher power under the irradiation of a white light from a backlight source, and display of a color image is achieved by the light after it passes through liquid crystal molecules in the liquid crystal display panel. The function served by the photoluminescent devices in the array substrate according to embodiments of the invention is similar to the function served by color filters in an existing color filter substrate. Producing the photoluminescent devices in the array substrate, not only simplifies a structure of the liquid crystal display panel, but also avoids an alignment error resulting from equipments when the array substrate and the color filter substrate are cell-assembled. Thus, the aperture ratio of the liquid crystal display panel can be increased. Furthermore, the luminous efficiency of the photoluminescent device is relatively high, so that the power consumption of the whole display device can be reduced.

Exemplarily, the photoluminescent device according to embodiments of the invention is a light-emitting film layer, which is a non-conductive film layer. The light-emitting film layer does not require any electrode to be disposed at two sides thereof and does not need to be connected to any electric circuit, and can emit light just under the irradiation of a backlight source. Moreover, the photoluminescent device has a simple structure. Furthermore, with a light-emitting film layer, the whole photoluminescent device is implemented as a surface light source instead of a point light source, and the luminous efficiency and luminous intensity of the surface light source are relatively high. The design manner of the light-emitting film layer can also endow the whole array substrate with a thinner thickness, in favor of realizing a light, thin display device.

Exemplarily, the photoluminescent device according to embodiments of the invention is not limited to the light-emitting film layer, and may also be a photoluminescent device having the other structure.

Figure 2:
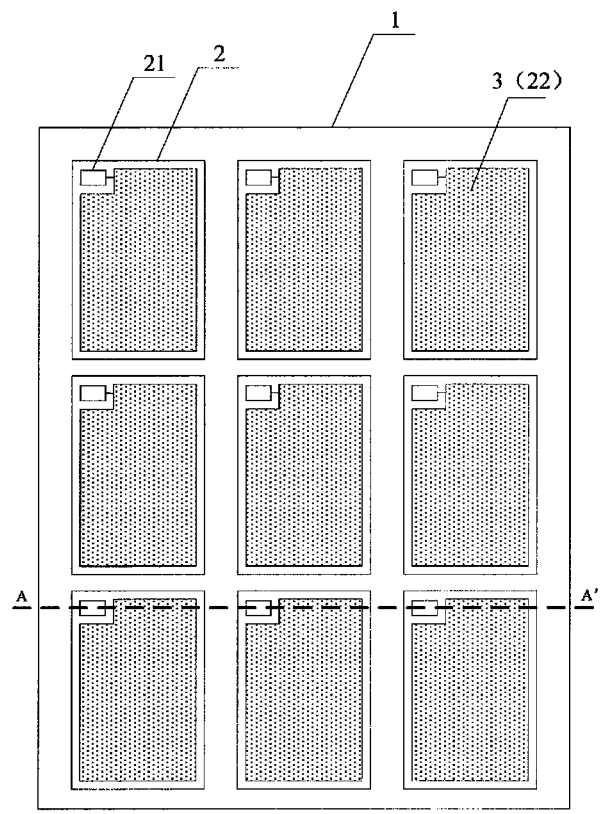
FIG. 2 is a second schematically top view illustrating an array substrate provided by an embodiment of the invention.

Exemplarily, referring to FIG. 2, a thin film transistor TFT 21 serving the function of a switch and a pixel electrode 22 connected to a drain electrode of the TFT 21 are comprised in each of sub-pixel units 2 of the array substrate; and a photoluminescent device 3 (or a light-emitting film layer) is located in each of the sub-pixel units.

Exemplarily, the photoluminescent device in a form of a film layer may cover a region where the sub-pixel unit is located.

In view of the fact that in each of the sub-pixel units, the pixel electrode takes a percentage of 90% or above in a whole area of the sub-pixel unit, and the pixel electrode is located on a substrate, the photoluminescent device in the form of a film layer may be located at a side of the pixel electrode close to the substrate or far away from the substrate. Exemplarily, this may be determined by a position where the pixel electrode is located, and the pixel electrode may be produced after manufacturing various film layer structures of the TFT, and may also be produced prior to manufacturing various film layer structures of the TFT. When the pixel electrode is produced after manufacturing various film layer structures of the TFT, the photoluminescent device may be located below the pixel electrode, and when the pixel electrode is produced prior to manufacturing various film layer structures of the TFT, the photoluminecent device may be located at a side of the pixel electrode far away from the substrate. It depends on circumstances during concrete implementations, and no any limit will be set here.

The photoluminescent device 3 in the form of a film layer may be set in a whole region where the whole sub-pixel unit 2 is located, i.e. it overlaps a region where the pixel electrode 22 and the TFT 21 are located (as shown in FIG. 1); or, be set in a region where the pixel electrode 22 is located, so that it overlaps the region where the pixel electrode 22 is located (as shown in FIG. 2) or is smaller than the region where the pixel electrode 22 is located.

Exemplarily, in the event that the photoluminescent device is located in the whole region where the whole sub-pixel unit is located, a phenomenon of local light leakage can be effectively avoided, thereby improving the display quality.

Figure 3:
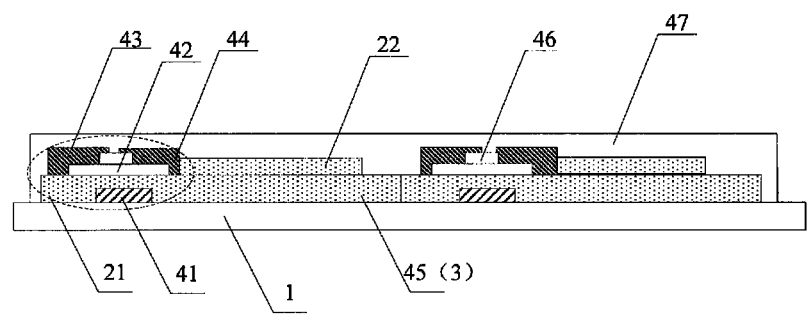
FIG. 3 is a schematically cross-sectional view illustrating the array substrate shown in FIG. 2 taken along line A-A'.

FIG. 3 is a cross-sectional view illustrating the array substrate shown in FIG. 2 taken along line A-A'. As shown in FIG. 3, the pixel electrode 22 and the TFT 21 are disposed on the substrate 1; the TFT 21 comprises a gate electrode 41, an active layer 42, a source electrode 43 and a drain electrode 44, as well as a gate insulating layer 45 located between the gate electrode 41 and the active layer 42, an etch stop layer 46 located between the active layer 42 and a source/drain layer 43 or 44 (the source electrode and the drain electrode are provided in the same layer, and a film layer where the source electrode and the drain electrode are located is briefly called as the source/drain layer), and a passivation layer 47 located in an outermost layer of the TFT 21 (namely, the TFT 21 is covered by the passivation layer 47), wherein, the pixel electrode 22 is connected to the drain electrode 44.

Exemplarily, the photoluminescent device may be located at a side of the gate insulating layer or the passivation layer far away from the substrate, namely, a photoluminescent film layer is produced separately on the gate insulating layer or the passivation layer. Exemplarily, the photoluminescent devices may employ existing light-emitting film layers emitting red light, green light or blue light as the photoluminescent devices according to embodiments of the invention. In order to eliminate the impact of manufacturing of subsequent film layers on the light-emitting film layer, exemplarily, a protective layer may be further produced subsequent to the photoluminescent film layer.

In order to simplify a structure of the array substrate, exemplarily, the photoluminescent device may be in the same film layer as the gate insulating layer or passivation layer, wherein, the gate insulating layer or passivation layer has a function of emitting red light, green light or blue light under irradiation of light. Exemplarily, the gate insulating layer or passivation layer is formed of photoluminescent material or formed of silicon nitride and/or silicon oxide and photoluminescent material.

Exemplarily, in the course of producing each insulating layer that covers the whole substrate on the array substrate, at a place corresponding to a sub-pixel unit, the insulating layer is made to be an insulating layer containing photoluminescent material that emits light with the same color as the corresponding sub-pixel unit, and the insulating layer is in the same film layer as the photoluminescent devices. The insulating layer is not limited to a gate insulating layer or passivation layer. Referring to FIG. 3, the gate insulating layer 45 and the photoluminescent devices 3 are in the same film layer.

Exemplarily, material for the light-emitting layer may be a quantum dot light-emitting material, but is not limited thereto.

Exemplarily, the quantum dot light-emitting material may be nanometer material consisting of group II-VI or group III-V elements. For example, the nanometer material consisting of group II-VI elements may be CdS, CdSe, CdTe, ZnO, ZnS, ZnSe, ZnTe, ZnCdS or the like, but is not limited thereto. The nanometer material consisting of group III-V elements may be GaAs, GaP, GaAs, GaSb, HgS, HgSe, HgTe, InAs, InP, InSb, AlAs, AlP, AlSb, InAlAs or the like, but is not limited thereto.

Nanometer materials consisting of different elements have different emitting colors. For example, InAlAs and CdTe emit red light under the irradiation of light, CdSe and ZnSe emit green light under the irradiation of light, and ZnCdS emits blue light under the irradiation of light. Light-emitting materials for emitting red light, green light and blue light are not limited InAlAs, CdTe, CdSe, ZnSe and ZnCdS as stated. Any quantum dot light-emitting materials that emit red light, green light and blue light under the irradiation of light available now may be applicable to embodiments of the invention.

It is to be noted that, lights emitted by quantum dots of different materials under the irradiation of the same light source differ in color, and lights emitted by quantum dots of the same material with different sizes under the irradiation of the same light source also have a difference in color.

A manufacturing method of an array substrate provided by an embodiment of the invention will be briefly described below with reference to an example in which quantum dots are produced in a gate insulating layer, wherein, the gate insulating layer and a light-emitting film layer are the same film layer.

Step 1, a gate electrode of a TFT in each sub-pixel unit is formed on a substrate.

Step 2, a gate insulating layer for the TFT is formed on the substrate with the gate electrode formed; the gate insulating layer covers the whole substrate; and the gate insulating layer may be a silicon oxide layer or a silicon nitride layer. With a respective mask and by adopting an epitaxial growth method, red-emitting quantum dots grow in regions of the silicon oxide layer or silicon nitride layer corresponding to red sub-pixel units, and regions corresponding to green and blue sub-pixel units are shielded by the mask; next, with a respective mask and by adopting an epitaxial growth method, green-emitting quantum dots grow in regions of the silicon oxide layer or silicon nitride layer corresponding to green sub-pixel units; and finally, by adopting an epitaxial growth method, blue-emitting quantum dots grow in regions of the silicon oxide layer or silicon nitride layer corresponding to blue sub-pixel units. Photoluminescent devices for emitting lights in different colors are formed in different regions of the silicon oxide layer or silicon nitride layer. For example, a photoluminescent device for emitting red light is formed in a region where a red sub-pixel unit is located, a photoluminescent device for emitting green light is formed in a region where a green sub-pixel unit is located, and a photoluminescent device for emitting blue light is formed in a region where a blue sub-pixel unit is located.

It is to be noted that, an order in which the quantum dots are produced in the insulating layer may be the one that the green-emitting quantum dots are formed firstly, and in this case, red and blue sub-pixel units are shielded with a mask. Embodiments of the invention do not set a limit to this.

It is to be noted that, a method for producing the quantum dots in the insulating layer is not limited to the epitaxial growth method. For example, the quantum dots are made into an electronic gel, and a quantum dot pattern for emitting red light, green light or blue light is produced on a substrate with a gate insulating layer formed thereon by using a rotation method, a dip coating method, an ink-jet printing method or the like.

It is to be noted that, embodiments of the invention have been described merely with various insulating layers in a TFT covering the whole substrate as an example, light-emitting devices in the form of a film layer provided by embodiments of the invention is in the same film layer as any insulating layer that covers the whole substrate in the array substrate, and the insulating layer has a function of emitting red light, green light or blue light at a corresponding sub-pixel unit under the irradiation of light.

A liquid crystal display panel provided by an embodiment of the invention will be described below in connection with the above array substrate.

The liquid crystal display panel stated in the embodiment of the invention may be a liquid crystal display panel of a Twisted Nematic (TN) mode or a Vertical Alignment (VA) mode, a liquid crystal display panel of an In-Plane-Switching (IPS) mode and an Advanced SuperDimension Switch (ADS) mode, or the like.

Figure 4:
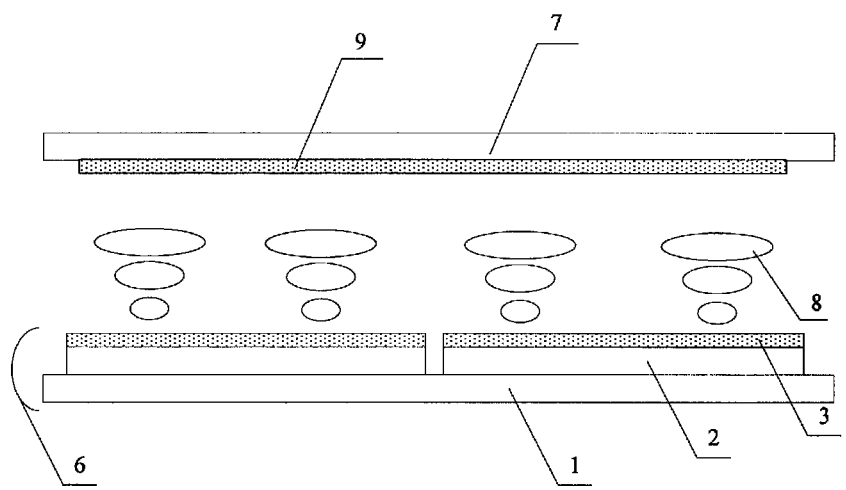
FIG. 4 is a structural view illustrating a liquid crystal display panel provided by an embodiment of the invention.

Referring to FIG. 4, the liquid crystal display panel provided by the embodiment of the invention comprises: a second substrate 6 and a first substrate 7 disposed opposite each other, and a liquid crystal layer 8 located between the second substrate 6 and the first substrate 7. The second substrate 6 comprises: a substrate 1, a plurality of red, green and blue sub-pixel units 2 arranged in a matrix form; photoluminescent devices 3 that are located respectively in the red, green and blue sub-pixel units 2 and emit red light, green light and blue light in correspondence with the red, green and blue sub-pixel units 2 on a one-to-one correspondence relationship.

The liquid crystal display panel further comprises a common electrode 9. The common electrode 9 may be located on a side of the first substrate 7 close to the liquid crystal layer 8 (as shown in FIG. 4), and it may also be located on a side of the second substrate close to the liquid crystal layer.

When the common electrode is located on the side of the first substrate close to the liquid crystal layer, the liquid crystal display panel is a liquid crystal display panel of the TN mode or the VA mode; and when the common electrode is located on the side of the second substrate close to the liquid crystal layer, the liquid crystal display panel is a liquid crystal display panel of the IPS mode or the ADS mode.

The photoluminescent devices are the photoluminescent devices as mentioned above.

The second substrate is any array substrate as mentioned above.

Exemplarily, the first substrate is a protective substrate.

Figure 5:
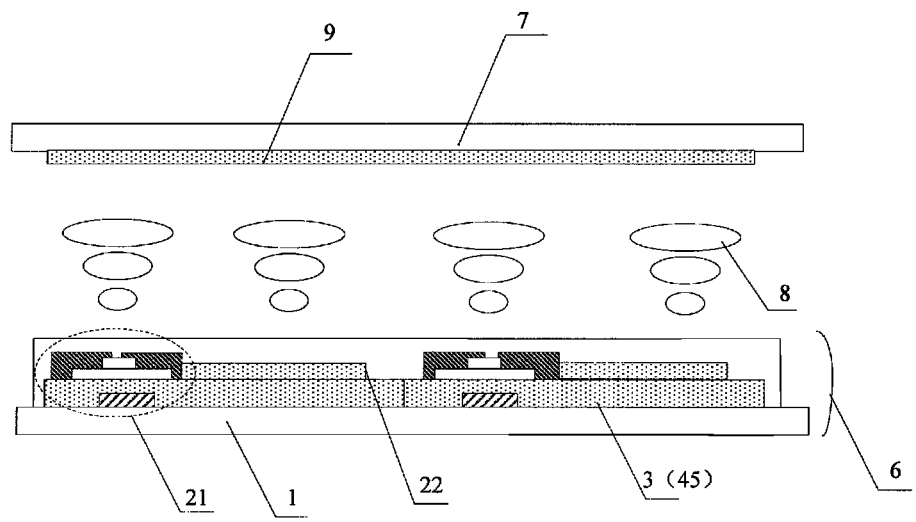
FIG. 5 is another structural view illustrating a liquid crystal display panel provided by an embodiment of the invention.

Exemplarily, referring to FIG. 5, the second substrate 6 in the liquid crystal display panel shown in FIG. 4 is the array substrate shown in FIG. 3, and each of the sub-pixel units comprises a pixel electrode 22 and a TFT 21. Each of photoluminescent devices 3 is located in the same layer as a gate insulating layer 45 of the TFT 21.

Figure 6:
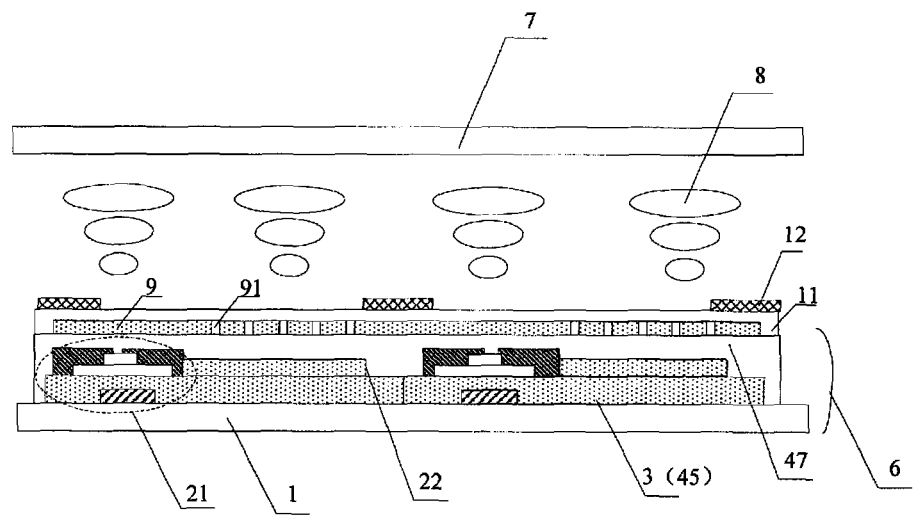
FIG. 6 is still another structural view illustrating a liquid crystal display panel provided by an embodiment of the invention.

As shown in FIG. 6, the common electrode 9 is located in the second substrate 6, and for example, located on a passivation layer 47. Herein, the common electrode 9 is located above the pixel electrode 22, and is a slit-like electrode having slits, and the pixel electrode 22 is a plate-like electrode.

A setting mode of the common electrode is not limited to a case where it is disposed above the pixel electrode, and may also be a case where it is disposed below the pixel electrode. When the common electrode is disposed below the pixel electrode, the common electrode is a plate-like electrode, and the pixel electrode is a slit-like electrode.

With the slit-like pixel electrode or common electrode, the utilization ratio of liquid crystal molecules in an ADS mode liquid crystal display panel can be improved, thereby improving the display effect of an image.

For a sake of improving the display quality of the image of the liquid crystal display panel and avoiding occurrence of a light leakage phenomenon, the liquid crystal display panel provided by an embodiment of the invention further comprises, a black matrix in correspondence with non-display regions between the sub-pixel units. The black matrix may be provided on the second substrate, and may also be provided on the first substrate.

Exemplarily, referring to FIG. 6, the liquid crystal display panel comprises: a planarization layer 11 located in the outermost layer of the second substrate 6, and it further comprises a black matrix 12 located on the planarization layer 11. As shown in FIG. 6, the planarization layer 11 is located on the common electrode 9; and the region where the black matrix 12 is located corresponds to a non-display area between any two sub-pixel units.

By arranging the black matrix to be located on the second substrate, such a problem that the aperture ratio of pixels are degraded owing to an alignment error between the first substrate and the second substrate when the black matrix is provided on a first substrate can be avoided.

With respect to the above liquid crystal display panel according to embodiments of the invention, the black matrix is produced directly on the array substrate, without the necessity of considering an equipment deviation occurs when a conventional array substrate and a color filter substrate are cell-assembled, and thus, the aperture ration of pixels can be effectively increased. It is a new display panel that possesses a larger aperture ratio, a purer chromaticity, a wider color gamut and a lower power consumption than an existing liquid crystal display device.

It is to be noted that, the liquid crystal display panel provided by embodiments of the invention also comprises: aligning layers that are located at sides of the array substrate and the protective substrate close to the liquid crystal layer, respectively; and polarizers that are respectively located at sides of the array substrate and the protective substrate far away from the liquid crystal layer and having optical axes perpendicular to each other.

Figure 7:
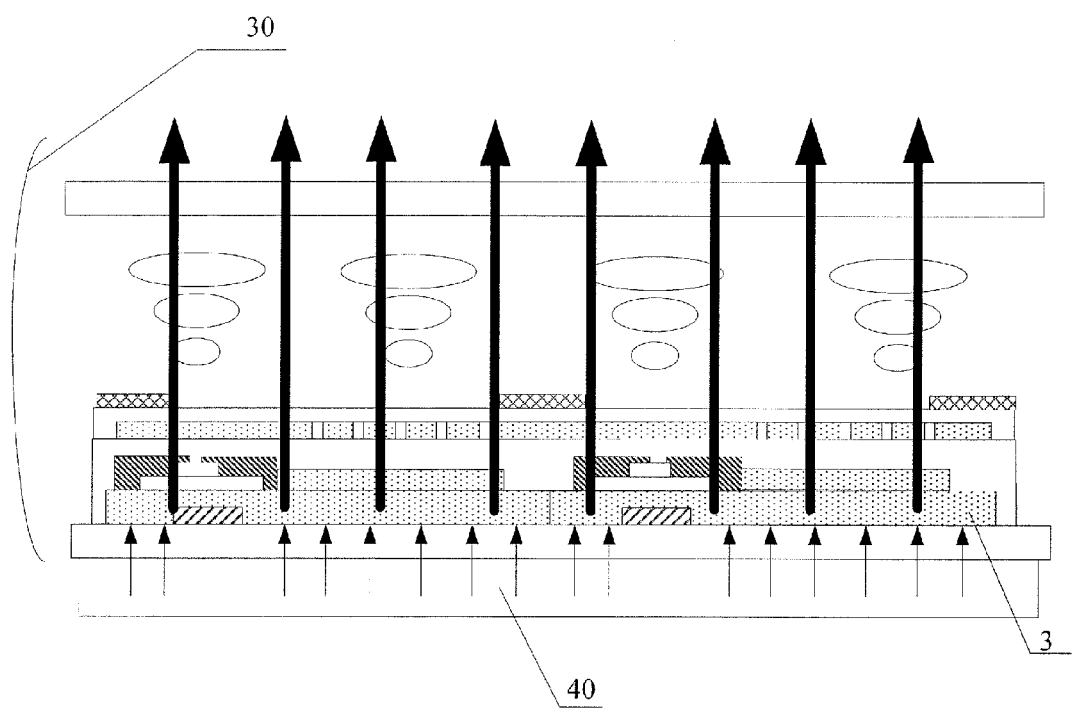
FIG. 7 shows a display device according to an embodiment of the invention.

Referring to FIG. 7, there is further provided a display device according to an embodiment of the invention, including the above liquid crystal display panel 30.

Exemplarily, it further comprises a backlight module 40 at a light entering side of the liquid crystal display panel 30; and photoluminescent devices 3 in the liquid crystal display panel 30 emit light under the irradiation of light from the backlight module in the backlight module 40, so as to achieve the image display. A line with an arrow in FIG. 7 denoted a light beam.

Exemplarily, the display device may be a cell phone, a tablet computer or a liquid crystal television, but is not limited thereto.

In summary, a liquid crystal display panel provided by embodiments of the invention comprises a first substrate, a second substrate and a liquid crystal layer located between the first substrate and the second substrate, the second substrate being an array substrate. The array substrate comprises: a substrate; a plurality of sub-pixel units, located on the substrate and arranged in a matrix form; and a plurality of photoluminescent devices, located in each of sub-pixel units and emitting light in correspondence with a color of the sub-pixel unit. There is unnecessary that color filters be provided on the first substrate, and display of an image is realized by providing photoluminescent devices capable of emitting lights in correspondence with colors of the sub-pixel units on the array substrate. A liquid crystal display panel with a simple structure can be achieved. The photoluminescent devices emit light under the irradiation of light with a lower power from the backlight module, and have a relatively high luminous efficiency. Thus, the power consumption of the display device can be reduced effectively.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. An array substrate, comprising:
    a substrate;
    a thin film transistor, formed on the substrate and comprising a source electrode, a drain electrode, a gate electrode and an active layer;
    a pixel electrode, formed on the substrate;
    a plurality of sub-pixel units, located on the substrate and arranged in a matrix form;
    a plurality of photoluminescent devices, each of which is located in a corresponding sub-pixel unit of the plurality of sub-pixel units, and each of which emits light with a corresponding color in correspondence with a color of the sub-pixel unit where it is located, wherein the plurality of photoluminescent devices are disposed in a same layer;
    a planarization layer located above the plurality of photoluminescent devices; and
    a black matrix disposed on a side of the planarization layer facing the liquid crystal layer, the black matrix being located in a non-display region between adjacent sub-pixel units.

2. The array substrate claimed as claim 1, wherein, each of the photoluminescent devices is a light-emitting film layer for emitting light with a corresponding color in correspondence with the sub-pixel unit where it is located, and the light-emitting film layer is an insulating layer.

3. The array substrate claimed as claim 2, wherein, each of the light-emitting film layers is formed of quantum dot light-emitting material for emitting light with a color in correspondence with the sub-pixel unit where it is located.

4. The array substrate claimed as claim 3, wherein, the quantum dot light-emitting material is formed of group II-VI or group III-V elements.

5. The array substrate claimed as claim 4, wherein, the quantum dot light-emitting material formed of group II-VI elements is CdS, CdSe, CdTe, ZnO, ZnS, ZnSe, ZnTe or ZnCdS, and the quantum dot light-emitting material formed of group III-V elements is GaAs, GaP, GaAs, GaSb, HgS, HgSe, HgTe, InAs, InP, InSb, AIAs, AIP, AlSb or InAlAs.

6. The array substrate claimed as claim 2, wherein, the light-emitting film layer covers an entire region of the sub-pixel unit where it is located.

7. The array substrate claimed as claim 2, wherein, the light-emitting film layer is disposed in a setting region of the pixel electrode and the thin film transistor of the sub-pixel unit where it is located, a setting region of the pixel electrode, or a part of the setting region of the pixel electrode.

8. The array substrate claimed as claim 2, further comprising: a gate insulating layer and a passivation layer covering the thin film transistor, wherein the light-emitting film layer is located at a side of the gate insulating layer or the passivation layer far away from the substrate; or the light-emitting film layer, and the gate insulating layer or the passivation layer are the same film layer.

9. The array substrate claimed as claim 8, wherein, a protective layer is further provided at a side of the light-emitting film layer far away from the substrate.

10. The array substrate claimed as claim 8, wherein, under a condition that the light-emitting film layer, and the gate insulating layer or the passivation layer are the same film layer, the gate insulating layer or the passivation layer is formed of photoluminescent material or is formed of silicon nitride and/or silicon oxide as well as photoluminescent material.

11. The array substrate claimed as claim 2, wherein, under a condition that the light-emitting film layer and the gate insulating layer or the passivation layer are the same film layer, the gate insulating layer or the passivation layer is a silicon nitride and/or silicon oxide layer, and a quantum dot for emitting a light with a corresponding color is formed in a region of the silicon nitride and/or silicon oxide layer corresponding to each of the sub-pixel units.

12. A liquid crystal display panel, comprising:
a first substrate;
a second substrate, being the array substrate claimed as claim 1, wherein the second substrate is cell-assembled with the first substrate;
a liquid crystal layer, interposed between the first substrate and the second substrate;
a common electrode, located at a side of the first substrate or the second substrate facing the liquid crystal layer.

13. The liquid crystal display panel claimed as claim 12, wherein the common electrode is located in the second substrate and located above the pixel electrode, the common electrode is a slit-like electrode, and the pixel electrode is a plate-like electrode.

14. The liquid crystal display panel claimed as claim 12, wherein the common electrode is located in the second substrate and located below the pixel electrode, the pixel electrode is a slit-like electrode, and the common electrode is a plate-like electrode.

15. The liquid crystal display panel claimed as claim 12, further comprising:
alignment layers, disposed at sides of the first substrate and the second substrate facing the liquid crystal layer, respectively;
an upper polarizer, disposed at a side of the first substrate facing away from the liquid crystal layer; and
a lower polarizer, disposed at a side of the second substrate facing away from the liquid crystal layer.

16. A display device, comprising:
a liquid crystal display panel, claimed as claim 12; and
a backlight source, disposed at a light entering side of the liquid crystal display panel.

17. An array substrate, comprising:
a substrate;
a thin film transistor, formed on the substrate and comprising a source electrode, a drain electrode, a gate electrode and an active layer;
a pixel electrode, formed on the substrate;
a plurality of sub-pixel units, located on the substrate and arranged in a matrix form;
a plurality of photoluminescent devices, each of which is located in a corresponding sub-pixel unit of the plurality of sub-pixel units, and each of which emits light with a corresponding color in correspondence with a color of the sub-pixel unit where it is located;
a planarization layer located above the plurality of photoluminescent devices; and
a black matrix disposed on a side of the planarization layer facing the liquid crystal layer, the black matrix being located in a non-display region between adjacent sub-pixel units.

18. The array substrate claimed as claim 17, wherein, each of the photoluminescent devices is a light-emitting film layer for emitting light with a corresponding color in correspondence with the sub-pixel unit where it is located, and the light-emitting film layer is an insulating layer.

19. The array substrate claimed as claim 18, wherein, each of the light-emitting film layers is formed of quantum dot light-emitting material for emitting light with a color in correspondence with the sub-pixel unit where it is located.

20. The array substrate claimed as claim 19, wherein, the quantum dot light-emitting material is formed of group II-VI or group III-V elements.

* * * * *